(12) United States Patent
Anzou et al.

(10) Patent No.: US 9,159,456 B2
(45) Date of Patent: Oct. 13, 2015

(54) SEMICONDUCTOR DEVICE

(71) Applicant: KABUSHIKI KAISHA TOSHIBA, Tokyo (JP)

(72) Inventors: Kenichi Anzou, Kanagawa (JP); Chikako Tokunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 14/185,739

(22) Filed: Feb. 20, 2014

(65) Prior Publication Data
US 2015/0124537 A1 May 7, 2015

(30) Foreign Application Priority Data
Nov. 5, 2013 (JP) .................... 2013-229362

(51) Int. Cl.
G11C 29/00 (2006.01)
G11C 29/12 (2006.01)
G11C 7/10 (2006.01)

(52) U.S. Cl.
CPC .......... *G11C 29/1201* (2013.01); *G11C 7/1078* (2013.01)

(58) Field of Classification Search
USPC ................. 365/201, 189.05, 189.12
See application file for complete search history.

(56) References Cited

U.S. PATENT DOCUMENTS 5,173,906 A 12/1992 Dreibelbis et al.
5,617,428 A * 4/1997 Andoh .................. 714/726
5,959,900 A * 9/1999 Matsubara ............... 365/189.05
7,275,187 B2 9/2007 Kawasaki
2007/0011535 A1 1/2007 Anzou et al.

FOREIGN PATENT DOCUMENTS

| | | |
|---|---|---|
| CN | 100359608 | 1/2008 |
| DE | 69130693 | 7/1999 |
| EP | 0472818 | 12/1998 |
| EP | 1394812 | 3/2004 |
| JP | H06-342040 | 12/1994 |
| JP | 2000-331499 | 11/2000 |
| JP | 2005-004822 | 1/2005 |
| JP | 4157066 | 9/2008 |
| JP | 4179827 | 11/2008 |
| JP | 4664535 | 4/2011 |
| KR | 20040019981 | 3/2004 |
| TW | I223275 | 11/2004 |

* cited by examiner

Primary Examiner — Vu Le
(74) Attorney, Agent, or Firm — Knobbe, Martens, Olson & Bear, LLP

(57) ABSTRACT

A semiconductor device of an embodiment is provided with a memory, a register configured to store a first data group including test data and read/write instruction data to the memory, a first inversion portion having an inverting function of a value of the test data outputted from the register, a second inversion portion having the inverting function of a value of the read/write instruction data outputted from the register, first and second input portions configured to input a data inversion instruction to the first and second inversion portions, and a data switching portion configured to switch between a test data group obtained by applying predetermined processing to the first data group outputted from the register through the first and second inversion portions and a second data group used for reading/writing of data held in the memory during a system operation as input data into the memory.

20 Claims, 5 Drawing Sheets

SEMICONDUCTOR DEVICE

CROSS-REFERENCE TO RELATED APPLICATION

This application is based upon and claims the benefit of priority from the prior Japanese Patent Application No. 2013-229362 filed on Nov. 5, 2013; the entire contents of which are incorporated herein by reference.

FIELD

Embodiments described herein relate generally to a semiconductor device.

BACKGROUND

A method of detecting a failure by building in a built-in self test circuit (hereinafter abbreviated as a BIST circuit) and a memory device built in a semiconductor device and using the BIST circuit in a manufacture/shipment test is usually conducted. The BIST circuit includes different types of circuits depending on the method of detecting a failure. For example, a comparator type BIST circuit configured to discriminate presence of a failure by comparing written data and read data and a compressor type BIST circuit in which a read-out result is compressed in the BIST circuit and presence of a failure is discriminated on the basis of the compressed result can be cited.

However, a memory BIST circuit represented by the comparator type BIST circuit and the compressor type BIST circuit needs to configure various functions for realizing the self test (a data generating function, an address generating function, a control signal generating function, a result analyzing function, for example) in a device as a logical circuit. There is a problem that a circuit scale increases since these logical circuits are implemented. Particularly, if a total bit amount of the memory device is relatively small, if the number of targeted memory circuits is small as one or two, or if a scale of a logical circuit portion other than the memory device is small, the scale increase of the entire semiconductor device with addition of the BIST circuit becomes a non-negligibly large ratio.

In order to reduce the increase in the circuit scale caused by addition of the BIST circuit, test contents and the analyzing function need to be reduced. However, it is likely that such reduction might damage important functions involved in a quality of the manufacture/shipment test, which is not realistic.

DETAILED DESCRIPTION

A semiconductor device of the present embodiment is provided with a memory configured to hold data and a register configured to store a first data group including test data to be written in the memory and read/write instruction data instructing a reading or writing operation to the memory. Moreover, a first inversion portion having a function of inverting a value of the test data outputted from the register, a second inversion portion having a function of inverting a value of the read/write instruction data outputted from the register, a first input portion configured to input a data inversion instruction to the first inversion portion, and a second input portion configured to input the data inversion instruction to the second inversion portion are provided. Moreover, a data switching portion configured to switch between a test data group obtained by applying predetermined processing to the first data group outputted from the register through the first and second inversion portions and a second data group used for reading/writing the data held in the memory during a system operation as input data into the memory is also provided.

The embodiments will be described below by referring to the attached drawings.

First Embodiment

Figure 1:
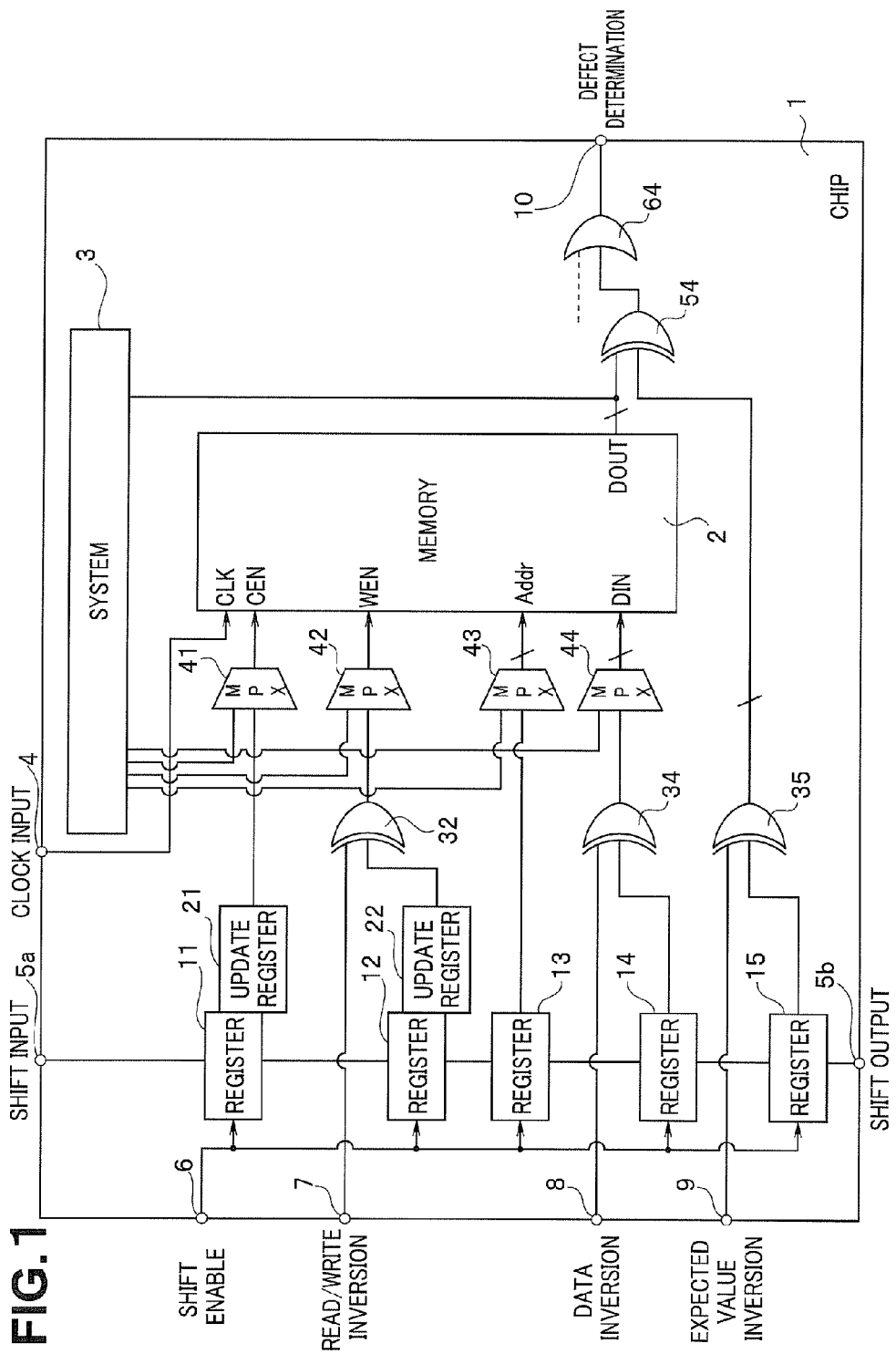
FIG. 1 is an outline block diagram for explaining a configuration of a semiconductor device according to a first embodiment of the present invention.

FIG. 1 is an outline block diagram for explaining a configuration of a semiconductor device according to a first embodiment. As illustrated in FIG. 1, in the semiconductor device of the present embodiment, a memory 2, a test circuit and a system 3 are arranged on a same chip 1. On the chip 1, various terminals (a clock signal input terminal 4, shift data input/output terminals 5a and 5b, a shift enable signal input terminal 6, a read/write inversion signal input terminal 7, a data inversion signal input terminal 8, an expected value inversion signal input terminal 9, and a defect determination result output terminal 10) configured to input/output various signals required for a test from/to an outside of the chip 1 with respect to the memory 2 are provided.

On the memory 2, a clock signal input terminal CLK configured to input a clock signal for synchronization of an operation, a chip enable input terminal CEN configured to input a chip enable signal for validating an operation instruction to the memory 2, and a write enable input terminal WEN configured to input a write enable signal instructing a writing operation or a reading operation are provided. Moreover, on the memory 2, an address input terminal Addr configured to input address data configured to instruct an address position where a writing or reading operation is performed and a test data input terminal DIN configured to input test data are arranged. Moreover, on the memory 2, a data output terminal DOUT configured to output stored data is provided.

Note that the address input terminals Addr are provided in plural for a bit width of the address data to be inputted. For example, if the address data is composed of 8 bits, eight address input terminals Addr provided in the memory 2. Moreover, since the test data is usually composed of a plurality of bits, the test data input terminals DIN are also provided in plural for a bit width of the test data to be inputted. For example, if the test data is composed of 20 bits, 20 data input terminals DIN are provided in the memory 2. Furthermore, the test data output terminals DOUT are also provided in plural for the bit width of the test data. For example, if the test data is composed of 20 bits, 20 data output terminals DOUT are provided in the memory 2.

Note that various types of data (a chip enable signal, a write enable signal, address data, and test data) which are a test data group used in a test are inputted into predetermined input terminals of the memory 2 through MPXs (multiplexers) 41, 42, 43, and 44 which are data switching portions, respectively. Data (a second data group) used for reading/writing of the memory 2 during a usual system operation is from the system 3 also connected to an input side of each of the MPXs 41 to 44. That is, data used during a test operation and data used during a usual system operation can be switched and inputted to the memory 2 by switching the MPXs 41 to 44.

The clock signal input terminal 4 is a terminal configured to supply a clock signal for synchronizing a test operation to the memory 2. The clock signal is inputted to the memory 2 through a clock signal input terminal CLK. The shift data input terminal 5a is a terminal configured to supply various types of data required for the test of the memory 2. A data structure of the shift data will be described later in detail. Moreover, the shift data output terminal 5b is a terminal configured to output the shift data used in the test to the outside.

The shift enable signal input terminal 6 is a terminal configured to supply a shift instruction signal instructing an operation for shifting the shift data inputted from the shift data input terminal 5a by a predetermined bit (1 bit, for example). The read/write inversion signal input terminal 7 which is a second input terminal is a terminal configured to supply a read/write inversion instruction signal instructing switching between a writing operation and a reading operation of the test data with respect to the memory 2. The data inversion signal input terminal 8 which is a first input terminal is a terminal configured to supply a data inversion signal instructing switching between input as it is and inversion and input of the test data supplied from the shift input terminal 5a to the memory 2.

The expected value inversion signal input terminal 9 which is a third input terminal is a terminal configured to supply an expected value inversion signal instructing switching between use of a value supplied as the shift data as it is and use after inversion of the expected value data used in comparison with an output from the memory 2 at a test. The defect determination result output terminal 10 is a terminal configured to output non-defect/defect of the memory 2 as a determination result on the basis of a result of comparison between an output value from the memory 2 and an expected value.

Figure 2:
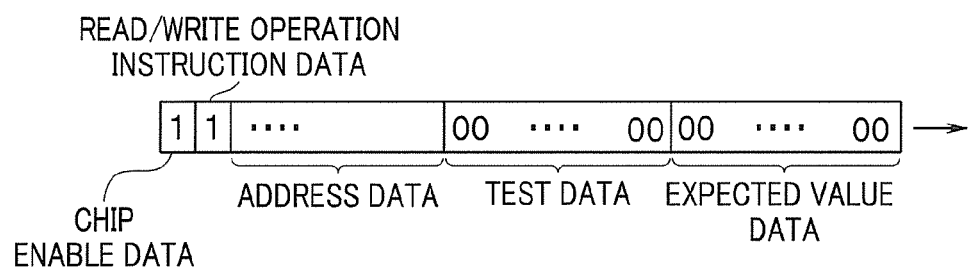
FIG. 2 is an outline diagram for explaining an example of shift data configuration inputted for a test.

The shift data which is the first data group inputted from the shift input terminal 5a is composed of each piece of data, that is, the expected value data, the test data, the address data indicating an address position where a writing or reading operation of the test data is conducted, the read/write operation instruction data, and the chip enable signal. FIG. 2 is an outline diagram for explaining an example of a configuration of the shift data to be inputted for test. As illustrated in FIG. 2, the expected value data, the test data, and the address data are usually composed of plural bits, respectively. Moreover, regarding the expected value data and the test data, a same bit number (20 bits, for example) of data as a bit width of the memory 2 is usually set. The read/write operation instruction data and the chip enable signal have 1 bit, respectively.

Registers 11 to 15 configured to store the shift data are provided on the chip 1. The registers 11 to 15 are composed of D-type F/F (flip-flop), for example. Each of the registers 11 to 15 is, as illustrated in FIG. 1, for example, composed as one shift register so that the data is shifted in the order of the register 11, the register 12, the register 13, the register 14, the register 15, and the shift output terminal 5b from the shift input terminal 5a. A shift instruction signal is inputted to each of the registers 11 to 15 from the shift enable terminal 6, respectively. If a value ("0", for example) instructing an enable state is inputted as the shift instruction signal, the shift data given to the shift input terminal 5a is shifted by 1 bit in synchronization with the shift clock. If a value ("1", for example) instructing a disenable state is inputted as the shift instruction signal, a shift operation of the shift data is not performed. Note that the registers 11 to 15 may be composed not as one but as a plurality of shift registers.

The register 11 stores the chip enable signal. The chip enable signal stored in the register 11 is inputted to the chip enable input terminal CEN of the memory 2 through a register 21 with an update function and the MPX (the multiplexer) 41. Note that the register 21 with the update function will be described later in detail.

The register 12 stores reading/writing operation instruction data. The read/write operation instruction data stored in the register 12 is inputted into an EXOR element 32 configured to take an exclusive logical sum which is a second inversion portion (a register 22 with an update function will be described later in detail)through the register 22 with the update function. A read/write inversion instruction signal is also inputted into the EXOR element 32 from the read/write inversion signal input terminal 7. Therefore, an exclusive logical sum of the read/write instruction data and the read/write inversion instruction signal is outputted from the EXOR element 32 and inputted into the write enable input terminal WEN of the memory 2 through the MPX 42 as the write enable signal.

That is, if an operation instructed by the read/write operation instruction data is to be executed by the memory 2, "0" is inputted as the read/write inversion instruction signal. On the other hand, if an operation opposite to the operation instructed by the read/write instruction data is to be executed by the memory 2 (if the read/write instruction data instructs a writing operation, and the reading operation is to be executed by the memory 2, for example), "1" is inputted as the read/write inversion instruction signal.

The register 13 stores the address data. The address data stored in the register 13 is inputted into the address input terminal Addr of the memory 2 through the MPX 43. Note that the address data usually is composed of a plurality of bits, and the address input terminal Addr is arranged individually for each of the bits. For example, if the address data is composed of 8 bits, 8 address input terminals Addr are arranged on the memory 2.

The register 14 stores the test data. The test data stored in the register 14 is inputted into an EXOR element 34 which is a first inversion portion. The data inversion instruction signal is also inputted into the EXOR element 34 from the data inversion input terminal 8. Therefore, the exclusive logical sum of the test data and the data inversion instruction signal is outputted from the EXOR element 34 and inputted into the data input terminal DIN of the memory 2 through the MPX 42. Note that the test data is usually composed of a plurality of bits, and the EXOR element 34 and the data input terminal DIN are individually arranged for and connected to each of the bits. For example, if the test data is composed of 20 bits, 20 EXOR elements 34 and 20 data input terminals DIN are arranged. Moreover, an output of each of the EXOR elements 34 is connected to the corresponding data input terminals DIN, respectively.

The register 15 stores the expected value data. The expected value data stored in the register 15 is inputted into an EXOR terminal 35 which is a third inversion portion. The expected value inversion instruction signal is also inputted into the EXOR terminal 35 from the expected value inversion input terminal 9.

That is, if the data expected to be outputted from the memory 2 in a test matches the expected value data stored in the register 15, "0" is inputted as the expected value inversion instruction signal. On the other hand, if the data expected to be outputted from the memory 2 in a test is different from the expected value data stored in the register 15 (for example, if the data expected to be outputted from the memory 2 is "0" and the expected value data is "1"), "1" is inputted as the expected value inversion instruction signal. Note that the expected value data is usually composed of a plurality of bits, and EXOR elements 35 are individually arranged for each of the bits. For example, if the expected value data is composed of 20 bits, 20 EXOR elements 35 are arranged.

The expected value data outputted from each of the EXOR terminals 25 is inputted into an EXOR element 54 for test result comparison. Note that the EXOR elements 54 for test result comparison are provided in the same number as that of the EXOR elements 35. The expected value data outputted from the EXOR terminal 35 and test result data outputted from the data output terminal DOUT of the memory 2 are inputted into the EXOR element 54 for test result comparison. That is, the test result data and the expected value data are compared for each bit by the EXOR element 54 for result comparison. Each of the EXOR elements 54 outputs "0" if the test result data and the expected value data match each other and "1" if the test result data and the expected value data do not match each other as comparison result data.

The comparison result data outputted from all the EXOR elements 54 is inputted into an OR element 64 for defect determination. If all the inputted comparison result data of each bit is "0", the OR element 64 outputs "0" indicating non-defective as a determination result to the outside through the defect determination result output terminal 10. On the other hand, if there is at least one "1" in the comparison result data of each bit inputted into the OR element 64, the OR element 64 outputs "1" indicating defective as a defect determination result to the outside through the defect determination result output terminal 10.

Here, the registers 21 and 22 with update function will be described. The registers 21 and 22 with update function are registers composed of a latch, an F/F and the like. The registers 21 and 22 with update function output data before update even if the data of the connected registers 11 and 12 are updated while the shift instruction signal is a value instructing an enable state and the shift operation of the shift data is being performed. On the other hand, if the shift instruction signal becomes a value instructing a disenable state, the output data is updated by a subsequent clock pulse input.

Regarding an output of the bit of each of the registers 11 to 15 configured to store the shift data, the data being shifted at the point of time is outputted as it is during the shift operation. A change of the data during the shift operation does not have any meaning in an operation of the memory 2 but is random. If the chip enable signal inputted into the memory 2 from the chip enable input terminal CEN or the write enable signal inputted into the memory 2 from the write enable input terminal WEN during the shift operation changes, an unintended operation might be performed in the memory 2.

For example, assume that a writing operation with all the bits at "0" is performed for a certain address and then, a reading operation is performed for the same address. First, the shift data for the writing operation is inputted into each of the registers 11 to 15 from the shift input terminal 5a, and a clock signal is given and the data stored in each of the registers 11 to 15 is written in the memory 2. That is, the test data ("0", for example) stored in the register 14 is written for the address instructed by the address data stored in the register 13. Subsequently, the shift data for reading operation is inputted into each of the registers 11 to 15 from the shift input terminal 5a. If the write enable signal has a value instructing writing in the middle of the shift data input, an unintended writing operation is performed in the memory 2. Here, if the address where writing has been made immediately before and the address where the reading operation is to be performed subsequently are the same, the unintended writing for the address during the reading operation causes a problem that data to be read out is destroyed and a test cannot be conducted.

Thus, the register 21 with update function is arranged in the register 11 configured to store the chip enable signal and the register 22 with update function is arranged in the register 12 configured to store the read/write operation instruction data on respective output sides. By employing such configuration, unintended data writing in the memory 2 during the shift operation can be prevented, and a test operation can be performed correctly.

As described above, by configuring such that the various types of data required for the test of the memory 2 is inputted from the shift input terminal 5a and stored in the predetermined registers 11 to 15 and supplied to the memory 2 from the predetermined input terminals provided on the memory 2 in accordance with the clock signal, there is no need to configure various functions for realizing the self test as the BIST circuit (the data generating function, the address generating function, the control signal generating function, the result analyzing function, for example) as logical circuits in the device, and a memory test can be realized by adding a small-scale circuit.

Subsequently, a test method of the memory 2 in the semiconductor device configured as above will be described. First, the writing operation and the reading operation of the test data with respect to the memory 2 will be described. For example, if the writing operation of the predetermined test at a predetermined address in the memory 2 is to be performed, the shift clock is inputted while the shift enable data is kept at a value instructing the enable state. Then, the shift data is shifted so that a value for validating the operation instruction to the memory 2 is inputted as the chip enable signal ("0", for example) from the chip enable input terminal CEN into the memory 2, the value instructing the writing operation is inputted as the write enable signal ("0", for example) from the write enable input terminal WEN into the memory 2, the predetermined address is inputted as the address data from the address input terminal Addr into the memory 2, and moreover, the predetermined test data as the test data is inputted from the data input terminal DIN into the memory 2. Finally, by giving a pulse to the clock signal input terminal CLK, the operation of writing the predetermined test data at the predetermined address in the memory 2 is finished.

The reading operation is similar to the writing operation except that, though the shift data is shifted so that the value instructing the writing operation ("0", for example) is inputted from the write enable input terminal WEN into the memory 2 in the aforementioned writing operation, a change is made such that the shift data is shifted so that the value instructing the reading operation ("1", for example) is inputted from the write enable input terminal WEN into the memory 2.

In the test of the memory 2, a test algorithm of a type called a marching test is used in general. In the algorithm, a series of writing operations and reading operations are performed for each of the addresses in the memory 2. For example, in an algorithm called 13N marching test, a series of test operations such as "reading of data "0"", "writing of data "1"", and "reading of data "1"" are performed for one address, and when the operations are all finished, the operation proceeds to a test of a subsequent address.

Specific procedures of the series of test operations will be described. Prior to the test, it is assumed that "0" is set in the memory 2. First, the test of "reading of data "0"" is conducted. The shift data set such that the expected value data is "0" for all the bits, the test data is "0" for all the bits, the address data is the address to be tested, the read/write operation instruction data is a value performing the reading operation ("1", for example) and the chip enable signal is set to a value validating the operation instruction to the memory 2 ("0", for example) is shift-inputted from the shift input terminal 5a and stored in each of the registers 11 to 15.

Subsequently, "0" instructing a forward (non-inversion) state is inputted as the read/write inversion instruction signal from the read/write inversion signal input terminal 7. Since the test data is not used during the reading operation, an arbitrary value is inputted as the data inversion instruction signal (either one of "0" instructing the forward state and "1" instructing the inversion state may be used.). Moreover, a value instructing the disenable state ("1", for example) is inputted from the shift enable signal input terminal 6.

Subsequently, the clock signal is inputted from the clock signal input terminal 4 into the memory 2, and a pulse is given to the clock signal input terminal CLK. As a result, the chip enable signal stored in the register 11 is inputted from the chip enable input terminal CEN into the memory 2, and the operation instruction to the memory 2 is validated. Moreover, the exclusive logical sum of the value for performing the reading operation stored in the register 12 ("1", for example) and the value of "0" instructing the forward state which is the read/write inversion instruction signal, that is, the value for performing the reading operation ("1", for example) is outputted from the EXOR element 32. Therefore, the value for performing the reading operation ("1", for example) is inputted from the write enable input terminal WEN into the memory 2. As a result, the value set at the address is read out of the data output terminal DOUT corresponding to each of the bits in accordance with the address data (data stored in the register 13) inputted from the address input terminal Addr into the memory 2.

Subsequently, "0" instructing the forward (non-inversion) state is inputted as the expected value inversion instruction signal from the expected value inversion signal input terminal 9. As a result, the exclusive logical sum of the expected value data ("0") stored in the register 15 and the value of "0" instructing the forward state which is the expected value inversion instruction signal is outputted from the EXOR element 35. That is, the expected value data ("0") stored in the register 15 is outputted as it is from the EXOR element 35. In this state, the clock signal is inputted from the clock signal input terminal 4 into the memory 2, and the pulse is given to the clock signal input terminal CLK. As a result, the value read out of the memory 2 and the expected value outputted from the EXOR element 35 are compared at the EXOR element 54 which is a comparison portion.

If the values read out of the memory 2 are all "0", the value of "0" indicating matching is outputted from all the EXOR elements 35 into the OR element 64. Therefore, the value of "0" indicating non-defective is outputted from the OR element 64 into the defect determination result output terminal 10. On the other hand, if even only one bit has "1" in the values read out of the memory 2, the value of "1" indicating non-matching is outputted from the EXOR element 35 to which the bit is inputted into the OR element 64. Therefore, the value of "1" indicating defective is outputted from the OR element 64 into the defect determination result output terminal 10. As above, the test operation of "reading of the data "0"" is completed.

Subsequently, the test of "writing of the data "1"" is conducted. First, "1" instructing the inversion state is inputted as the read/write inversion instruction signal from the read/write inversion signal input terminal 7. Moreover, "1" instructing the inversion state is inputted as the data inversion instruction signal from the data inversion signal input terminal 8. When the clock signal is inputted from the clock signal input terminal 4 into the memory 2 and the pulse is given to the clock signal input terminal CLK, the exclusive logical sum of the value for performing the reading operation stored in the register 12 ("1", for example) and the value for instructing the inversion state which is a read/write inversion instruction signal, that is, the value for performing the writing operation ("0", for example) is outputted from the EXOR element 32. Therefore, the value for performing the writing operation ("0", for example) is inputted as the write enable signal from the write enable input terminal WEN into the memory 2. As a result, the value outputted from the EXOR element 34 is inputted into the data input terminal DIN in accordance with the address data (data stored in the register 13) inputted from the address input terminal Addr into the memory 2 and written at the respective corresponding addresses.

Here, the exclusive logical sum of the test data ("0") stored in the register 14 and "1" instructing the inversion state which is the data inversion instruction signal is outputted from the EXOR element 34. That is, the value obtained by inverting the test data ("0") stored in the register 14 is outputted from the EXOR element 34. Therefore, writing of "1" to all the bits is made for the predetermined address. As above, the test operation of the "writing of the data "1"" is completed.

Finally, the test of "reading of the data "1"" is conducted. First, "0" instructing the forward (non-inversion) state is inputted as a read/write inversion instruction signal from the read/write inversion signal input terminal 7. Since the test data is not used during the reading operation, an arbitrary value is inputted as the data inversion instruction signal similarly to the test of the "reading of the data "0"" (either one of "0" instructing the forward state and "1" instructing the inversion state may be used).

Subsequently, the clock signal is inputted from the clock signal input terminal 4 into the memory 2, and a pulse is given to the clock signal input terminal CLK. As a result, the exclusive logical sum of the value for performing the reading operation stored in the register 12 ("1", for example) and the value of "0" instructing the forward state which is the read/write inversion instruction signal, that is, the value for performing the reading operation ("1", for example) are outputted from the EXOR element 32. Therefore, the value for performing the reading operation ("1", for example) is inputted as the write enable signal from the write enable input terminal WEN into the memory 2. As a result, the value set to the address is read out of the data output terminal DOUT corresponding to the respective bits in accordance with the address data inputted into the memory 2 from the address input terminal Addr (data stored in the register 13).

Subsequently, "0" instructing the forward (non-inversion) state is inputted as the expected value inversion instruction signal from the expected value inversion signal input terminal 9. As a result, the exclusive logical sum of the expected value data ("0") stored in the register 15 and the value of "0" instructing the forward state which is the expected value inversion instruction signal is outputted from the EXOR element 35. That is, the expected value data ("0") stored in the register 15 is outputted as it is from the EXOR element 35. In this state, the clock signal is inputted from the clock signal input terminal 4 into the memory 2, and the pulse is given to the clock signal input terminal CLK. As a result, the value read out of the memory 2 and the expected value outputted from the EXOR element 35 are compared in the EXOR element 54. A comparison result of each bit in the EXOR element 54 is outputted to the OR element 64. The OR element 64 collects the comparison results of all the bits and outputs a defect/non-defect determination result to the defect determination result output terminal 10. As above, the test operation of the "reading out of the data "1"" is completed, and the series of the test operations of the 13N marching test for one address is finished.

In the conventional configuration, if the 13N marching test is to be conducted by using the shift data, the shift data needs to be inputted each time for each of the three test operations for one address. On the other hand, in the semiconductor device of the present embodiment, since the data to be inputted into the memory 2 can be changed by using the read/write inversion instruction signal, the data inversion instruction signal, and the expected value inversion instruction signal, the shift data itself does not have to be inputted each time for each operation, and the three test operations can be performed with one input of the shift data. Therefore, the test time can be reduced to approximately ⅓ as compared with the conventional semiconductor device.

As described above, according to the present embodiment, by configuring such that the various types of data required for the test of the memory 2 is inputted as the shift data from the outside and supplied to the memory 2 from the predetermined input terminal provided on the memory 2, the various functions for realizing the self test does not have to be configured as a logical circuit in the device as the BIST circuit, and the memory test can be realized by addition of a small-scale circuit.

Moreover, according to the present embodiment, since the read/write inversion instruction signal, the data inversion instruction signal, and the expected value inversion instruction signal can be inputted from the outside, the write enable signal, the test data, and the expected value data can be changed by these signals, and thus, the shift data does not have to be inputted again for each of the test operations in the series of the tests for the one address, thereby the test time period can be reduced.

Figure 3:
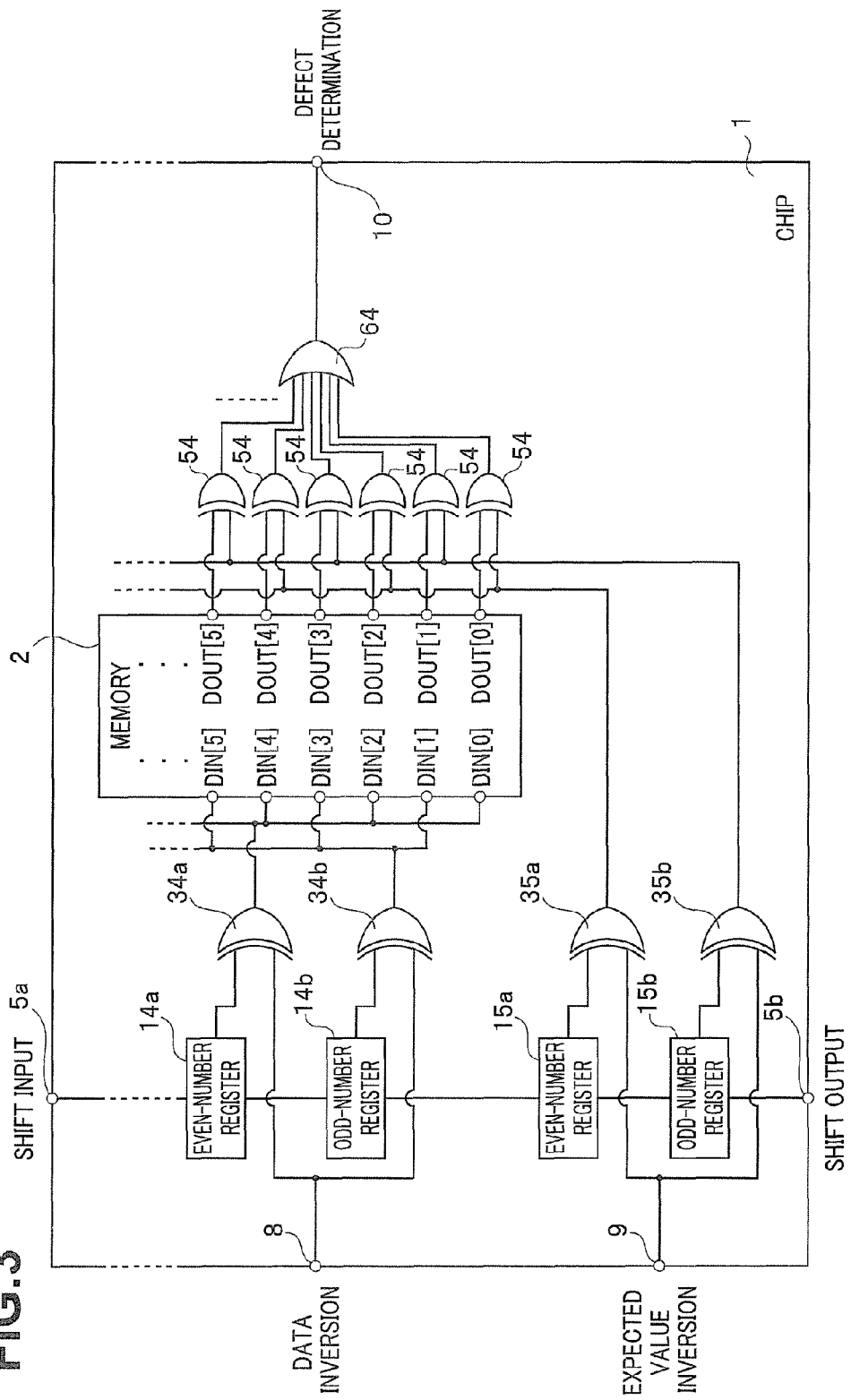
FIG. 3 is an outline block diagram for explaining another configuration of the semiconductor device according to the first embodiment of the present invention.

Note that in the aforementioned example, each of the register 14 configured to store the test data and the register 15 configured to store the expected value data is constituted by the register having a data width of the memory 2 but may be constituted by a register having a width smaller than that. For example, a configuration will be described in which the test of the memory 2 is conducted on a condition that an even-number bit uses the same data at any time, an odd-number bit also uses the same data at any time, and it is only necessary that a value can be freely set for the even-number bit and the odd-number bit, respectively, as the test data. In this case, the register configured to store the test data can be constituted by two registers, that is, a register 14a having a width of 2 bits for even-number bits and a register 14b having a width of 2 bits for odd-number bits. Similarly, the register configured to store the expected value data can be also constituted by two registers, that is, a register 15a having a width of 2 bits for even-number bits and a register 15b having a width of 2 bits for odd-number bits (see FIG. 3.). FIG. 3 is an outline block diagram for explaining another configuration of the semiconductor device according to the present embodiment of the present invention.

For the shift data inputted from the shift input terminal 5a, 2-bit test data, for example, is set as a value for testing the even-number bit of the memory 2 and a value for testing the odd-number bit. Moreover, 4-bit expected value data, for example, is set as an expected value for comparing with the output data from the even-number bit of the memory 2 and an expected value for comparing with the output data from the odd-number bit. When the shift input is made, the test data for the even-number bit is stored in the register 14a, and the test data for the odd-number bit is stored in the register 14b. Moreover, the expected value data for the even-number bit is stored in the register 15a, and the expected value data for the odd-number bit is stored in the register 15b.

If the clock signal is inputted into the memory 2, and the writing operation is started, the data stored in the register 14a is inputted into an EXOR element 34a. Moreover, the data stored in the register 14b is inputted into an EXOR element 34b. The EXOR element 34a outputs the exclusive logical sum with the data inversion instruction signal inputted from the data inversion signal input terminal 8 as the test data. An output side of the EXOR element 34a is branched and connected to even-number bit input terminals DIN[0], DIN[2], and DIN[4] in the data input terminals DIN of the memory 2. Therefore, the test data outputted from the EXOR element 34a is inputted into the even-number bit data input terminals DIN[0], DIN[2], DIN[4], . . . of the memory 2 and written in the corresponding even-number bits.

On the other hand, the EXOR element 34b outputs the exclusive logical sum with the data inversion instruction signal inputted from the data inversion signal input terminal 8 as the test data. An output side of the EXOR element 34b is branched and connected to odd-number bit input terminals DIN[1], DIN[3], and DIN[5] in the data input terminals DIN of the memory 2. The outputted test data is inputted into the odd-number bit data input terminals DIN[1], DIN[3], DIN[5], . . . of the memory 2 and written in the corresponding odd-number bits.

On the other hand, if the clock signal is inputted into the memory 2, and the reading operation is started, the data stored in the register 15a is inputted into an EXOR element 35a. Moreover, the data stored in the register 15b is inputted into an EXOR element 35b. The EXOR element 35a outputs the exclusive logical sum with the expected value inversion instruction signal inputted from the expected value inversion signal input terminal 9 as the expected value data. An output side of the EXOR element 35a is branched and connected to an input side of the EXOR element 54 connected to even-number bit output terminals DOUT[0], DOUT[2], and DOUT[4] in the data output terminals DOUT of the memory 2. The EXOR element 35b also outputs the exclusive logical sum with the expected value inversion instruction signal inputted from the expected value inversion signal input terminal 9 as the expected value data. An output side of the EXOR element 35b is branched and connected to the input side of the EXOR element 54 connected to the even-number bit output terminals DOUT[1], DOUT[3], and DOUT[5] in the data output terminals DOUT of the memory 2.

By configuring as above, the bit width of each of the registers 14a, 14b, 15a, and 15b configured to store the test data and the expected value data can be made 2 bits, respectively, and moreover, it is only necessary that the EXOR element 34 for inverting the test data and the EXOR element 35 for inverting the expected value data are arranged one each on the output sides of the registers 14a, 14b, 15a, and 15b, respectively, and thus, the circuit scale to be added for test can be made smaller.

Figure 4:
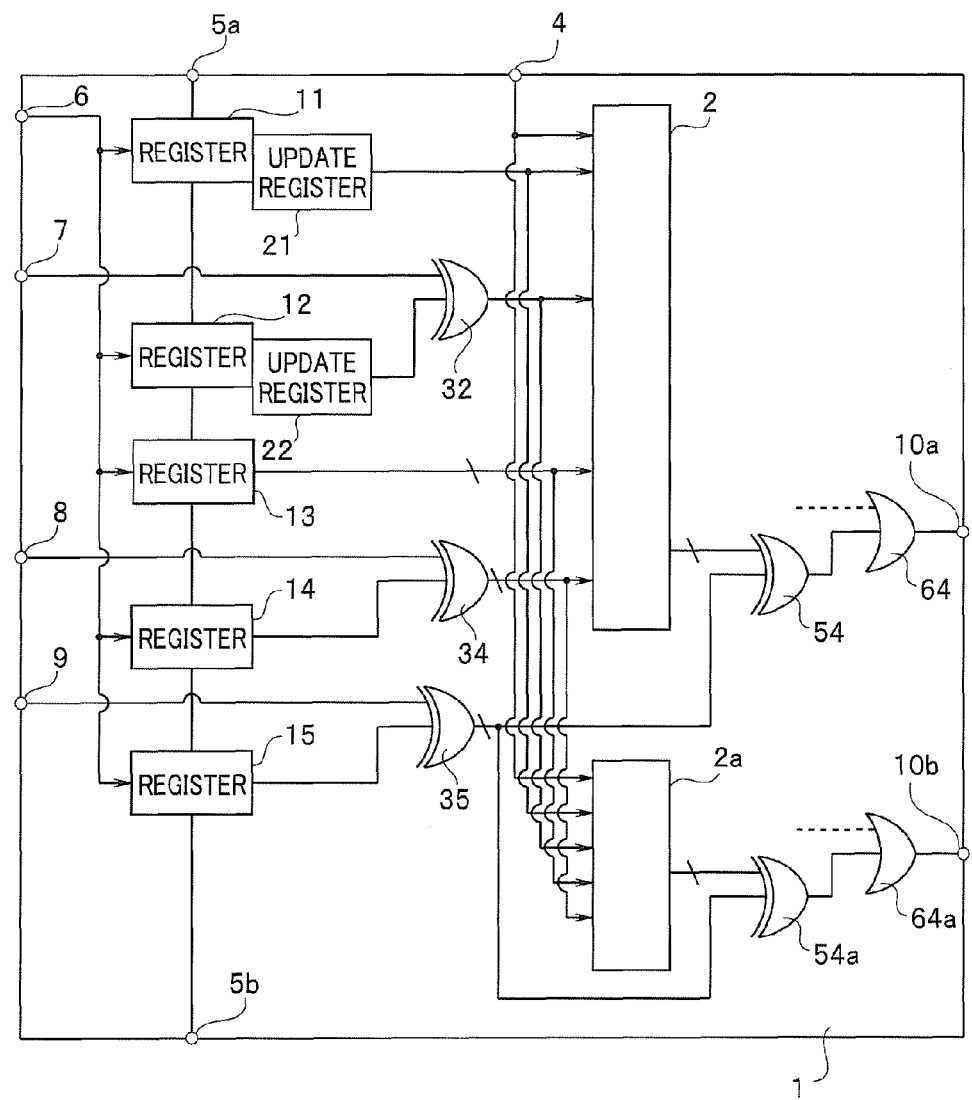
FIG. 4 is an outline block diagram for explaining a configuration of the semiconductor device provided with a plurality of memories 2.

Moreover, if a plurality of the memories 2 are provided on the chip 1, too, the plurality of memories can be tested at the same time using the test circuit of the semiconductor device of the present embodiment. FIG. 4 is an outline block diagram for explaining a configuration of the semiconductor device provided with the plurality of memories 2.

As illustrated in FIG. 4, if two memories 2 and 2a are arranged on the chip 1, for example, branch wiring is made so that the data (the clock signal, the chip enable signal, the write enable signal, the address data, and the test data) inputted into the memory 2 is also inputted into the chip 2a. That is, the branch wiring is made so that the clock signal outputted from the clock input terminal 4 is inputted into the clock signal input terminals CLK of the chips 2 and 2a, and the chip enable signal outputted from the update register 21 is inputted into the chip enable signal input terminals CEN of the chips 2 and 2a. Moreover, branch wiring is made so that the write enable signal outputted from the EXOR element 32 is inputted into the write enable input terminals WEN of the chips 2 and 2a, and the address data outputted from the register 13 is inputted into the address input terminals Addr of the chips 2 and 2a. Moreover, branch wiring is made so that the test data outputted from the EXOR element 34 is inputted into the data input terminals DIN of the chips 2 and 2a.

Note that an EXOR element 54a configured to compare the output data from the memory 2a with the expected value data and an OR element 64a configured to make a defect determination are preferably arranged separately without being made common with the memory 2a.

By configuring as above, the shift data can be made common by the plurality of memories arranged on the chip, and the plurality of memories can be tested at the same time only by adding a circuit for test on the data output side from the memory. (Second Embodiment)

The semiconductor device of the aforementioned first embodiment is configured only to determine defect/non-defect of a specific address of the memory and not to locate a defective bit. On the other hand, the present embodiment is different in a point that if defect determination is made for a specific address, identification of the defective bit can be made. The semiconductor device of the present embodiment has the same constituent elements as those in the first embodiment other than a register 16 configured to store mask data for identifying a defective bit and an AND element 74 for masking comparison result, and the same reference numerals are given and the explanation will be omitted.

Figure 5:
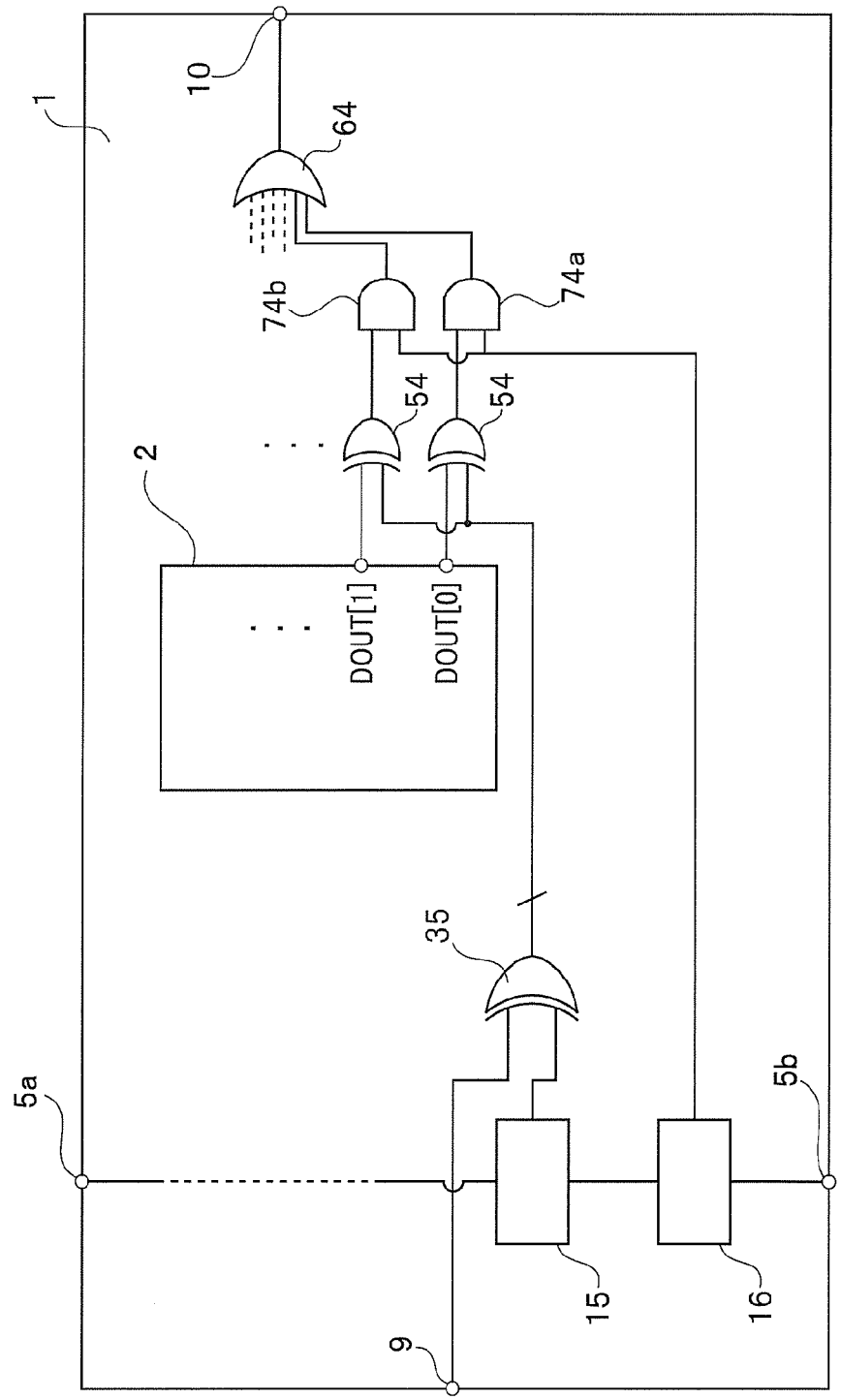
FIG. 5 is an outline block diagram for explaining a configuration of the semiconductor device according to the second embodiment of the present invention.

A configuration of a portion configured to identify a defective bit in the semiconductor device in the present embodiment will be described by using FIG. 5. FIG. 5 is an outline block diagram for explaining a configuration of the semiconductor device according to the second embodiment.

As illustrated in FIG. 5, in the semiconductor device of the present embodiment, the register 16 configured to store the mask data is provided between the register 15 configured to store the expected value data and the shift output terminal 5b. Moreover, an AND element 74 configured to mask a comparison result is provided between the EXOR element 54 configured to compare the output data from the memory 2 with the expected value data and the OR element 64 configured to make a defect determination of the entirety. The EXOR element 54 and the AND element 74 are associated with each other on a one-to-one basis, and an output from the corresponding EXOR element 54 and a value of a predetermined bit of the mask data stored in the register 16 are inputted into each of the AND elements 74. Outputs from the AND elements 74 are all inputted into the OR element 64.

The mask data having a bit width of the memory 2 is added to the shift data before the expected value data. An initial set value of the mask data is "1" for all the bits. The mask data is stored in the mask register 16 by the shift input. First, similarly to the first embodiment, the reading operation of the data stored in the memory 2 is performed, and defect determination is made for all the bits of a target address. Output data outputted from the output terminal DOUT of the memory 2 and the expected value data outputted from the register 15 are compared for matching/non-matching for each bit in the EXOR element 54. A comparison result is inputted into the AND element 74. The comparison result and the mask data outputted from the register 16 are inputted into the AND element 74. Since the mask data has "1" for all the bits, the comparison result in the EXOR element 54 is inputted as it is into the OR element 64. If the comparison result of all the inputted bits is "0", that is, if the output data matches the expected value data for all the bits, the OR element 64 outputs "0" indicating non-defective as a determination result.

On the other hand, if "1" is included in the comparison result of all the inputted bits, that is, if a result that the output data does not match the expected value data is included, the OR element 64 outputs "1" indicating defective as the determination result. In this case, identification of a defective bit is continued. First, the value is set to "0" for a bit other than the specific bit for which defect determination is made in the mask data. Then, the reading operation of the data stored in the memory 2 is performed. The output data outputted from the output terminal DOUT of the memory 2 and the expected value data outputted from the register 15 are compared for matching/non-matching for each bit in the EXOR element 54. The comparison result is inputted into the AND element 74.

The comparison result and the mask data outputted from the register 16 are inputted into the AND element 74. Here, "0" is outputted from the AND element 74 to which "0" is inputted as the mask data regardless of the value of the comparison result inputted from the EXOR element 54. On the other hand, from the AND element 74 to which "1" is inputted as the mask data, the comparison result in the EXOR element 54 which is not a defect determination target is inputted as it is into the OR element 64. Therefore, a value outputted from the OR element 64 becomes a comparison result of the specific bit to which "1" is inputted as the mask data.

If "0" is outputted from the OR element 64, the determination target bit is not defective, and thus, defect determination is made for another bit by changing the mask data. On the other hand, if "1" is outputted from the OR element 64, the determination target bit is identified to be defective.

As described above, by adding the mask data, the register 16 configured to store the mask data, and the AND element 74 configured to mask the comparison result between the output data and the expected value data in the present embodiment, a bit of a defect determination target can be limited to a specific range. Therefore, the memory test can be realized only by adding a small-scale circuit, and even detection of a defective bit can be made.

Each "portion" in the present specification is a concept corresponding to each of the functions in the embodiments and does not necessarily correspond to a specific hardware or software routine on a one-to-one basis. Therefore, a virtual circuit block (portion) having each function of the embodiments is assumed in explanation of the embodiments of the present specification.

While certain embodiments have been described, these embodiments have been presented by way of example only, and are not intended to limit the scope of the inventions. Indeed, the novel apparatuses, methods and circuits described herein may be embodied in a variety of other forms; furthermore, various omissions, substitutions and changes in the form of the apparatuses, methods and circuits described herein may be made without departing from the spirit of the inventions. The accompanying claims and their equivalents are intended to cover such forms or modifications as would fall within the scope and spirit of the inventions.

What is claimed is:

1. A semiconductor device comprising:
a memory configured to hold data;
a register configured to store a first data group including test data to be written in the memory and read/write instruction data instructing an operation of reading or writing to the memory;
a first inversion portion having a function of inverting a value of the test data outputted from the register;
a second inversion portion having a function of inverting a value of the read/write instruction data outputted from the register;
a first input portion configured to input a data inversion instruction to the first inversion portion;
a second input portion configured to input the data inversion instruction to the second inversion portion; and
a data switching portion configured to switch between a test data group obtained by applying predetermined processing to the first data group outputted from the register through the first and second inversion portions and a second data group used for reading/writing of the data held in the memory during a system operation as input data to the memory.

2. The semiconductor device according to claim 1, wherein the register is a shift register and is configured so that a value of the read/write instruction data is not changed during a shift operation of the register.

3. The semiconductor device according to claim 2, wherein the first data group includes chip enable data configured to set validity/invalidity of an operation instruction to the memory, and a value of the chip enable data stored in the register is configured not to be changed during the shift operation of the register.

4. The semiconductor device according to claim 1, wherein expected value data to be compared with output data from the memory is also stored in the register, the expected value data outputted from the register is inputted into a comparison portion configured to make a comparison with output data from the memory for each bit through a third inversion portion having a function of inverting a value of inputted data, and a logical sum of a comparison result in the comparison portion for all the bits of the output data outputted at a same timing is outputted as a test result.

5. The semiconductor device according to claim 4, further comprising:
a third input portion configured to input a data inversion instruction to the third inversion portion.

6. The semiconductor device according to claim 5, wherein mask data specifying a range of bits in which the output data and the expected value data are compared is also stored in the register, regarding a bit not included in bits of the range specified by the mask data, a comparison result between the output data and the comparison data is forcedly considered to match each other, and a logical sum of the comparison result for all the bits of the output data outputted at a same timing is calculated and outputted as a test result.

7. The semiconductor device according to claim 3, wherein expected value data to be compared with the output data from the memory is also stored in the register, the expected value data outputted from the register is inputted into a comparison portion configured to make a comparison with output data from the memory for each bit through a third inversion portion having a function of inverting a value of inputted data, and a logical sum of a comparison result in the comparison portion for all the bits of the output data outputted at a same timing is outputted as a test result.

8. The semiconductor device according to claim 7, further comprising:
a third input portion configured to input a data inversion instruction to the third inversion portion.

9. A semiconductor device comprising:
a memory configured to hold data;
a test data processing portion configured to generate a test data group by processing a first data group inputted from an outside; and
a data switching portion configured to switch between the test data group and a second data group used for reading/writing of the data held in the memory during a system operation as input data into the memory, wherein
the first data group includes test data to be written in the memory and read/write instruction data instructing an operation of reading or writing to the memory; and the test data processing portion has a register configured to store the first data group, a first inversion portion having a function of inverting a value of the test data outputted from the register, a second inversion portion having a function of inverting a value of the read/write instruction data outputted from the register, a first input portion configured to input a data inversion instruction to the first inversion portion, and a second input portion configured to input the data inversion instruction to the second inversion portion.

10. The semiconductor device according to claim 9, wherein
the register is a shift register and is configured so that a value of the read/write instruction data is not changed during a shift operation of the register.

11. The semiconductor device according to claim 10, wherein
the first data group includes chip enable data configured to set validity/invalidity of an operation instruction to the memory, and a value of the chip enable data stored in the register is configured not to be changed during the shift operation of the register.

12. The semiconductor device according to claim 9, further comprising:
a plurality of the memories, wherein
the test data processing portion supplies the generated test data groups to each of the memories.

13. The semiconductor device according to claim 9, wherein
a bit width of the test data is equal to or less than a bit width of the memory.

14. The semiconductor device according to claim 9, wherein
the first inversion portion is composed of one or more exclusive logical sum elements and a number of the exclusive logical sum elements is not more than a number of test data input terminals in the memory.

15. A semiconductor device, comprising:
a memory configured to hold data;

a test data processing portion configured to generate a test data group by processing a first data group inputted from an outside;
a data switching portion configured to switch between the test data group and a second data group used for reading/writing of the data held in the memory during a system operation as input data into the memory; and
a determination portion configured to make a defect determination of the memory from output data from the memory and expected value data included in the first data group, wherein
the first data group includes test data to be written in the memory and read/write instruction data instructing an operation of reading or writing to the memory; the test data processing portion has a register configured to store the first data group, a first inversion portion having a function of inverting a value of the test data outputted from the register, a second inversion portion having a function of inverting a value of the read/write instruction data outputted from the register, a first input portion configured to input a data inversion instruction to the first inversion portion, and a second input portion configured to input the data inversion instruction to the second inversion portion, and the determination portion has a third inversion portion having a function of inverting a value of the expected value data outputted from the register, a comparison portion configured to compare expected value data outputted from the third inversion portion and output data from the memory for each bit, and a determination result calculation portion configured to output a logical sum of a comparison result in the comparison portion as a determination result.

16. The semiconductor device according to claim 15, wherein
the determination portion is provided with a third input portion configured to input a data inversion instruction to the third inversion portion.

17. The semiconductor device according to claim 15, wherein
the register is a shift register and is configured so that a value of the read/write instruction data is not changed during a shift operation of the register.

18. The semiconductor device according to claim 17, wherein
the first data group includes chip enable data configured to set validity/invalidity of an operation instruction to the memory, and a value of the chip enable data stored in the register is configured not to be changed during the shift operation of the register.

19. The semiconductor device according to claim 16, wherein
mask data specifying a range of bits in which the output data and the expected value data are compared is also stored in the register, regarding a bit not included in bits of the range specified by the mask data, a comparison result between the output data and the comparison data is forcedly considered to match each other, and a logical sum of the comparison result for all the bits of the output data outputted at a same timing is calculated and outputted as a test result.

20. The semiconductor device according to claim 16, wherein
a bit width of the expected value data is not more than a bit width of output data of the memory.

* * * * *